United States Patent
Yim et al.

(10) Patent No.: US 9,704,928 B2
(45) Date of Patent: Jul. 11, 2017

(54) ORGANIC LIGHT EMITTING DIODE DISPLAY

(71) Applicant: SAMSUNG DISPLAY CO., LTD., Yongin-si, Gyeonggi-do (KR)

(72) Inventors: Sang Hoon Yim, Suwon-si (KR); Dong Chan Kim, Gunpo-si (KR); Won Jong Kim, Suwon-si (KR); Eung Do Kim, Seoul (KR); Dong Kyu Seo, Hwaseong-si (KR); Jong Hyuk Lee, Seoul (KR); Da Hea Im, Incheon (KR); Yoon Hyeung Cho, Yongin-si (KR); Chang Woong Chu, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/875,456

(22) Filed: Oct. 5, 2015

(65) Prior Publication Data
US 2016/0300893 A1    Oct. 13, 2016

(30) Foreign Application Priority Data
Apr. 7, 2015    (KR) .......................... 10-2015-0049112

(51) Int. Cl.
| H01L 27/32 | (2006.01) |
| H01L 51/52 | (2006.01) |
| H01L 51/50 | (2006.01) |

(52) U.S. Cl.
CPC ...... *H01L 27/3218* (2013.01); *H01L 27/3248* (2013.01); *H01L 51/5004* (2013.01); *H01L 51/5221* (2013.01); *H01L 2251/301* (2013.01); *H01L 2251/558* (2013.01)

(58) Field of Classification Search
CPC ...................... H01L 27/3218; H01L 27/3248
See application file for complete search history.

(56) References Cited

U.S. PATENT DOCUMENTS

| 2013/0320308 A1* | 12/2013 | Lee ......................... H01L 51/52 257/40 |
| 2015/0333296 A1* | 11/2015 | Lee ...................... H01L 27/3216 257/40 |

FOREIGN PATENT DOCUMENTS

| KR | 10-2012-0049639 A | 5/2012 |
| KR | 10-2013-0032675 A | 4/2013 |
| KR | 10-2013-0068920 A | 6/2013 |

OTHER PUBLICATIONS

Website: "Why do most metals appear silver in color with gold being an exception from a scattering and EM viewpoint?", Physics Stack Exchange, Visible Light, http://physics.stackexchange.com/questions/74760/why-do-most-metals-appear-silver-in-color-with-gold-being-an-exception-from-a-sc, dated Jun. 12, 2015, 3 pages.

* cited by examiner

*Primary Examiner* — Douglas Menz
(74) *Attorney, Agent, or Firm* — Lewis Roca Rothgerber Christie LLP (57) ABSTRACT

An organic light emitting diode display including a substrate, a thin film transistor on the substrate, a first electrode connected to the thin film transistor, a first layer on the first electrode, an emission layer on the first layer, a second layer on the emission layer, and a second electrode on the second layer.

13 Claims, 4 Drawing Sheets

ORGANIC LIGHT EMITTING DIODE DISPLAY

CROSS-REFERENCE TO RELATED APPLICATION

This application claims priority to and the benefit of Korean Patent Application No. 10-2015-0049112, filed in the Korean Intellectual Property Office on Apr. 7, 2015, the entire content of which is incorporated herein by reference.

BACKGROUND

1. Field

The following disclosure relates to an organic light emitting diode display.

2. Description of the Related Art

An organic light emitting diode display is a self-light emitting display device displaying an image through an organic light emitting element.

In a structure of a general organic light emitting diode display, there is a substrate, a first electrode is positioned on the substrate, an organic layer including an emission layer (EML) is positioned on the first electrode, and a counter electrode is positioned on the organic layer. The organic layer may include an incidental layer assisting with injection and/or transferring of holes between the first electrode and the emission layer, and an incidental layer assisting with injection and/or transferring of electrons between the emission layer (EML) and a second electrode.

A driving principle of the organic light emitting diode display having the aforementioned structure is as follows. If a voltage is applied between the first electrode and the second electrode, the holes are injected into the emission layer through the incidental layer assisting with injection and/or transferring of the holes from the first electrode, and the electrons are injected into the emission layer through the incidental layer assisting with injection and/or transferring of the electrons from the second electrode. The holes and the electrons injected into the emission layer are recombined in the emission layer to generate excitons, and light is emitted while the excitons are transferred from an excited state to a lower or ground state. In this case, light is generated by generated energy, and the organic light emitting diode display displays an image by using the generated light.

The above information disclosed in this Background section is only for enhancement of understanding of the background of the invention and therefore it may contain information that does not form the prior art that is already known in this country to a person of ordinary skill in the art.

SUMMARY

Aspects of embodiments of the present invention are directed toward an organic light emitting diode display having excellent light emitting efficiency.

According to an exemplary embodiment of the present invention, there is provided an organic light emitting diode display including: a substrate; a thin film transistor on the substrate; a first electrode connected to the thin film transistor; a first layer on the first electrode; an emission layer on the first layer; a second layer on the emission layer; and a second electrode on the second layer, wherein a thickness d of the emission layer and the second layer satisfies the following $$d = \frac{\lambda}{4k} - \alpha$$

where, $\lambda$ is a light wavelength, k is an absorption coefficient, and $\alpha$ is an adjustment factor.

In an embodiment, the emission layer includes a red emission layer, a green emission layer, and a blue emission layer.

In an embodiment, the adjustment factor varies according to an emission color of the emission layer.

In an embodiment, the adjustment factor includes a red adjustment factor $\alpha_r$, a green adjustment factor $\alpha_g$, and a blue adjustment factor $\alpha_b$.

In an embodiment, values of the red adjustment factor $\alpha_r$, the green adjustment factor $\alpha_g$, and the blue adjustment factor $\alpha_b$ are increased in the stated order.

In an embodiment, thicknesses of the red emission layer and the second layer are 700 Å or less.

In an embodiment, thicknesses of the green emission layer and the second layer are 600 Å or less.

In an embodiment, thicknesses of the blue emission layer and the second layer are 460 Å or less.

In an embodiment, a ratio of the thickness of the red emission layer and the second layer to the thickness of the blue emission layer and the second layer is about 1.4 to about 1.8.

In an embodiment, a ratio of the red adjustment factor $\alpha_r$ to the blue adjustment factor $\alpha_b$ is about 1.6 to about 2.0.

In an embodiment, a material of the second electrode is any one selected from silver (Ag) and an alloy thereof.

In an embodiment, the first electrode is an anode and the second electrode is a cathode.

In an embodiment, the first layer includes a hole transport layer and/or a hole injection layer.

In an embodiment, the second layer includes an electron transport layer and/or an electron injection layer.

According to an exemplary embodiment of the present invention, it is possible to provide an organic light emitting diode display having excellent light emitting efficiency.

DETAILED DESCRIPTION

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Figure 1:
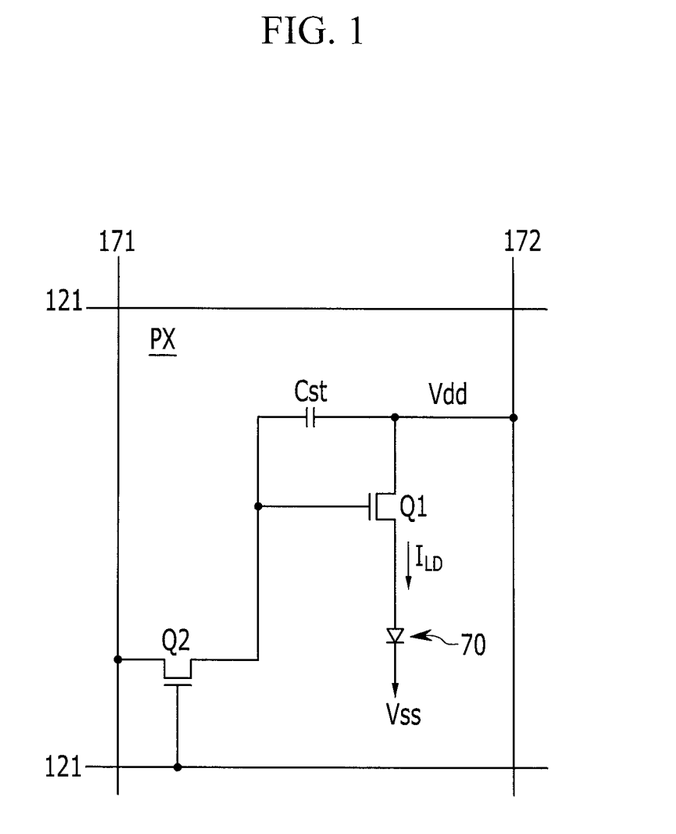
FIG. 1 is a circuit diagram of a pixel of an organic light emitting diode display according to an exemplary embodiment of the present invention.

In the drawings, the thickness of layers, films, panels, regions, etc., are exaggerated for clarity. Like reference numerals designate like elements throughout the specification. First, a pixel of an organic light emitting diode display according to an exemplary embodiment of the present invention will be described with reference to FIG. 1. FIG. 1 is a circuit diagram of the pixel of the organic light emitting diode display according to the exemplary embodiment of the present invention.

Referring to FIG. 1, the organic light emitting diode display according to the exemplary embodiment of the present invention includes a plurality of signal lines 121 and 171, and a plurality of pixels PX connected thereto and arranged in an approximate matrix form.

The signal lines include a plurality of first signal lines 121 transferring a gate signal (or a scan signal), a plurality of second signal lines 171 transferring a data signal, and a plurality of third signal lines 172 transferring a driving voltage Vdd. The first signal lines 121 extend in an approximate row direction and are almost or substantially parallel to each other, and the second signal lines 171 and the third signal lines 172 cross the first signal lines 121 to extend in a column direction and are almost or substantially parallel to each other.

Each pixel PX includes a switching thin film transistor Q2, a driving thin film transistor Q1, a storage capacitor Cst, and an organic light emitting diode (OLED) 70.

The switching thin film transistor Q2 has a control terminal, an input terminal, and an output terminal, the control terminal is connected to the first signal line 121, the input terminal is connected to the second signal line 171, and the output terminal is connected to the driving thin film transistor Q1. The switching thin film transistor Q2 responds to the scan signal applied to the first signal line 121 to transfer the data signal applied to the second signal line 171 to the driving thin film transistor Q1.

The driving thin film transistor Q1 also has a control terminal, an input terminal, and an output terminal, the control terminal is connected to the switching thin film transistor Q2, the input terminal is connected to the third signal line 172, and the output terminal is connected to the organic light emitting diode 70. The driving thin film transistor Q1 allows an output current $I_{LD}$ having a magnitude that varies according to a voltage applied between the control terminal and the output terminal to flow.

The capacitor Cst is connected between the control terminal and the input terminal of the driving thin film transistor Q1. The capacitor Cst charges the data signal applied to the control terminal of the driving thin film transistor Q1 and maintains the data signal even after the switching thin film transistor Q2 is turned-off.

The organic light emitting diode 70 has an anode connected to the output terminal of the driving thin film transistor Q1, and a cathode connected to a common voltage Vss. The organic light emitting diode 70 displays an image by emitting light while changing the intensity according to the output current $I_{LD}$ of the driving thin film transistor Q1.

Figure 2:
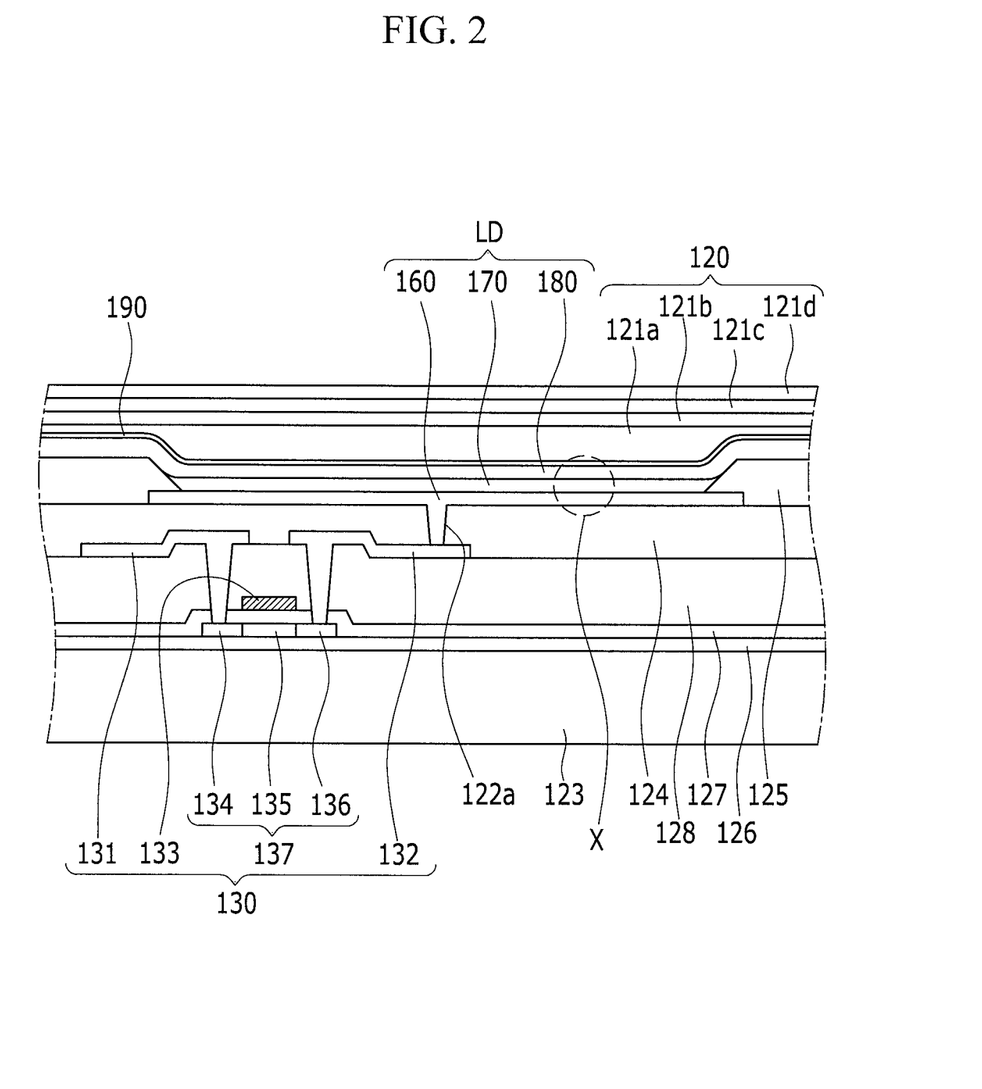
FIG. 2 is a cross-sectional view of the organic light emitting diode display according to the exemplary embodiment of the present invention.
Figure 3:
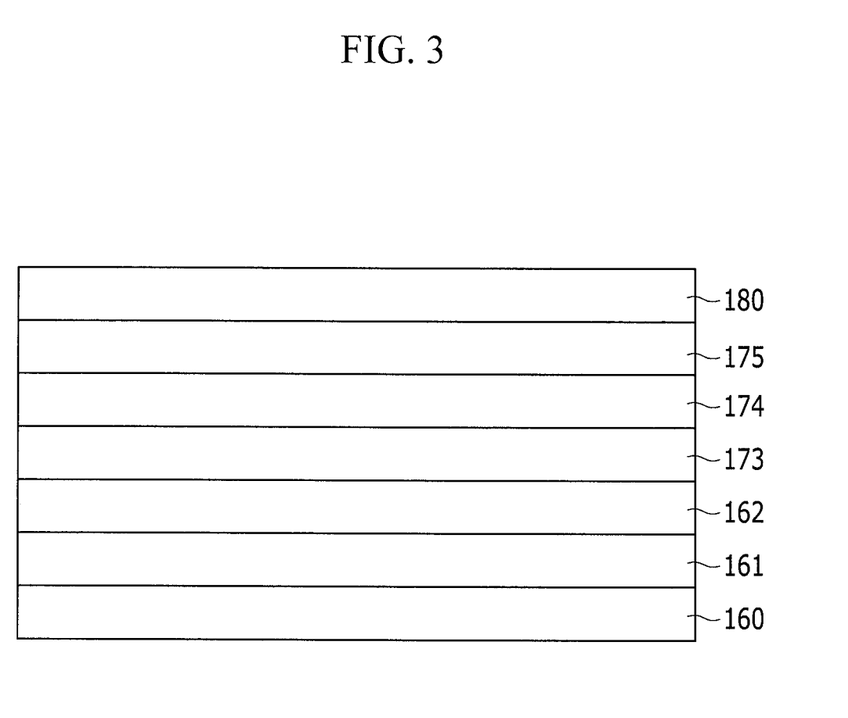
FIG. 3 is an enlarged cross-sectional view of a light emitting element according to the exemplary embodiment of the present invention.
Figure 4:
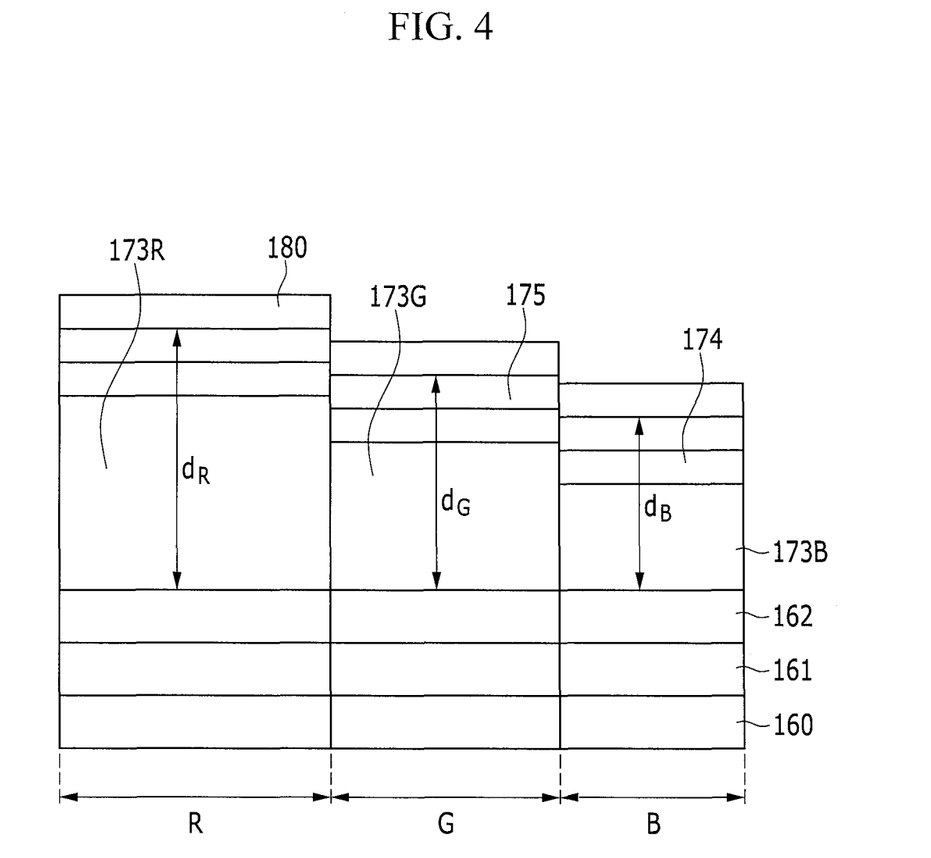
FIG. 4 is a comparative cross-sectional view of various light emitting elements according to the exemplary embodiment of the present invention.

Hereinafter, the organic light emitting diode display according to the exemplary embodiment of the present invention will be further described with reference to FIGS. 2 to 4. FIG. 2 is a cross-sectional view of the organic light emitting diode display according to the exemplary embodiment of the present invention. FIG. 3 is an enlarged cross-sectional view of a light emitting element according to the exemplary embodiment of the present invention. FIG. 4 is a comparative cross-sectional view of various light emitting elements according to the exemplary embodiment of the present invention.

Referring to FIGS. 2 and 3, the organic light emitting diode display according to the exemplary embodiment of the present invention includes a substrate 123, a thin film transistor (e.g., a driving thin film transistor) 130, a first electrode 160, first layers 161 and 162, an emission layer 173, second layers 174 and 175, and a second electrode 180.

The first layers 161 and 162 may include a hole injection layer 161 and a hole transport layer 162, and the second layers 174 and 175 may include an electron transport layer 174 and an electron injection layer 175.

In this case, the substrate 123 is formed of an insulating substrate made of glass, quartz, ceramics, plastics, and/or the like. However, the exemplary embodiment of the present invention is not limited thereto, and the substrate 123 may be a metallic substrate made of stainless steel and the like.

In addition, a substrate buffer layer 126 is positioned on the substrate 123. The substrate buffer layer 126 serves to reduce or prevent penetration of an impure element and planarize a surface.

In this case, the substrate buffer layer 126 may be formed of various suitable materials that can perform the aforementioned function. For example, as the substrate buffer layer 126, any one of a silicon nitride (SiNx) layer, a silicon oxide (SiOy) layer, and a silicon oxynitride (SiOxNy) layer may be used. However, the substrate buffer layer 126 is not the essential constitution, and may be omitted according to the kind and the process condition of the substrate 123.

A driving semiconductor layer 137 is positioned on the substrate buffer layer 126. A material of the driving semiconductor layer 137 may be a polysilicon layer. Further, the driving semiconductor layer 137 includes a channel region 135 in which an impurity is not doped, and a source region 134 and a drain region 136 formed by being doped at both sides of the channel region 135. Herein, the impurity varies according to the kind of thin film transistor.

A gate insulating layer 127 formed of silicon nitride (SiNx) and/or silicon oxide (SiOy) is positioned on the driving semiconductor layer 137. A gate wire including a driving gate electrode 133 is positioned on the gate insulating layer 127. In addition, the driving gate electrode 133 overlaps at least a portion of the driving semiconductor layer 137, for example, the channel region 135.

Further, an interlayer insulating layer 128 covering the driving gate electrode 133 is positioned on the gate insulating layer 127. In the gate insulating layer 127 and the interlayer insulating layer 128, contact holes (e.g., contact openings), through which the source region 134 and the drain region 136 of the driving semiconductor layer 137 are exposed, are positioned. The interlayer insulating layer 128, like the gate insulating layer 127, may be made by using a ceramic-based material such as silicon nitride (SiNx) or silicon oxide (SiOy).

In addition, a data wire including a driving source electrode 131 and a driving drain electrode (or a drain electrode) 132 is positioned on the interlayer insulating layer 128. Further, the driving source electrode 131 and the driving drain electrode 132 are connected to the source region 134 and the drain region 136 of the driving semiconductor layer 137, respectively, through contact holes formed in the interlayer insulating layer 128 and the gate insulating layer 127.

As described above, the driving thin film transistor 130 is formed to include the driving semiconductor layer 137, the driving gate electrode 133, the driving source electrode 131, and the driving drain electrode 132. The constitution of the driving thin film transistor 130 is not limited to the aforementioned examples, but can be variously modified by suitable constitution that can be easily carried out by those who are skilled in the art.

In addition, a planarization layer 124 covering the data wire is positioned on the interlayer insulating layer 128. The planarization layer 124 serves to remove a step and perform planarization in order to increase light emitting efficiency of the organic light emitting element to be formed thereon. Further, the planarization layer 124 has an electrode contact hole (e.g., an electrode contact opening) 122a through which a portion of the driving drain electrode 132 is exposed.

The planarization layer 124 may be made of one or more materials selected from an acryl-based resin (polyacrylates resin), an epoxy resin, a phenol resin, a polyamide-based resin (polyamides resin), a polyimide-based resin (polyimides resin), an unsaturated polyester-based resin (unsaturated polyesters resin), a polyphenylene-based resin (polyphenylenethers resin), a polyphenylene sulfide-based resin (polyphenylenesulfides resin), benzocyclobutene (BCB), and the like.

Herein, the exemplary embodiment according to the present invention is not limited to the aforementioned structure; for example, any one of the planarization layer 124 and the interlayer insulating layer 128 may be omitted.

In this case, an anode 160 that is the first electrode 160 of the organic light emitting element is positioned on the planarization layer 124.

The organic light emitting diode display includes a plurality of first electrodes 160 disposed for each of a plurality of pixels. In this case, the first electrodes 160 are disposed to be spaced apart from each other. The first electrode 160 is connected to the driving drain electrode 132 through the electrode contact hole 122a of the planarization layer 124.

Further, a pixel definition layer 125 having an opening through which the first electrode 160 is exposed is positioned on the planarization layer 124. That is, the pixel definition layer 125 has a plurality of openings formed for each pixel. In this case, an organic emission layer 170 may be positioned for each opening formed by the pixel definition layer 125. Accordingly, a pixel region in which each organic emission layer is formed may be defined by the pixel definition layer 125.

In this case, the first electrode 160 is disposed so as to correspond to the opening of the pixel definition layer 125. However, the first electrode 160 is not necessarily disposed in only the opening of the pixel definition layer 125, but a portion of the first electrode 160 may be disposed under the pixel definition layer 125 so as to overlap the pixel definition layer 125.

The pixel definition layer 125 may be made of resins such as a polyacryl-based resin (polyacrylates resin) and a polyimide-based resin (polyimides), silica-based inorganic materials, and/or the like.

Further, the organic emission layer 170 is positioned on the first electrode 160. A structure of the organic emission layer 170 will be described in more detail below.

In addition, the second electrode 180, that is, a cathode 180, may be positioned on the organic emission layer 170. As described above, the organic light emitting element LD including the first electrode 160, the organic emission layer 170, and the second electrode 180 is formed.

In this case, the first electrode 160 and the second electrode 180 may be each formed of a transparent conductive material or a transflective or reflective conductive material. According to the kind of material forming the first electrode 160 and the second electrode 180, the organic light emitting diode display may be a top emission type (kind), a bottom emission type (kind), or a dual emission type (kind).

Further, an overcoat 190 covering the second electrode 180 to protect the second electrode 180 may be positioned as an organic layer on the second electrode 180.

In addition, a thin film encapsulation layer 120 is positioned on the overcoat 190. The thin film encapsulation layer 120 protects the organic light emitting element LD and a driving circuit portion positioned on the substrate 123 from the outside by sealing.

The thin film encapsulation layer 120 includes encapsulation organic layers 121a and 121c and encapsulation inorganic layers 173 and 121d that are alternately laminated one by one. FIG. 2 illustrates, as an example, the case where two encapsulation organic layers 121a and 121c and two encapsulation inorganic layers 121b and 121d are alternately laminated one by one to constitute the thin film encapsulation layer 120, but the thin film encapsulation layer is not limited thereto.

Hereinafter, the organic light emitting element of the present invention will be described in more detail with reference to FIG. 3. FIG. 3 is a partial cross-sectional view illustrated by partially enlarging the organic light emitting element of FIG. 2.

The organic light emitting element (X portion of FIG. 2) according to the exemplary embodiment of the present invention has a structure where the first electrode 160, the hole injection layer 161, the hole transport layer 162, the emission layer 173, the electron transport layer 174, the electron injection layer 175, and the second electrode 180 are sequentially laminated.

That is, the organic emission layer 170 of FIG. 2 includes the first electrode 160, the hole injection layer 161, the hole transport layer 162, the emission layer 173, the electron transport layer 174, the electron injection layer 175, and the second electrode 180 of FIG. 3.

In this case, the hole injection layer 161 may be positioned on the first electrode 160. In this case, the hole injection layer 161 is a layer (e.g., a predetermined layer) improving (e.g., increasing rate of) injection of holes from the first electrode 160 into the hole transport layer 162. The hole injection layer 161 may include copper phthalocyanine (CuPc), poly(3,4)-ethylenedioxythiophene (PEDOT), polyaniline (PANI), N,N-dinaphthyl-N,N'-diphenyl benzidine (NPD), and/or the like, but is not limited thereto.

The hole transport layer 162 may be positioned on the hole injection layer 161. The hole transport layer 162 may serve to transport (e.g., smoothly transport) holes transferred from the hole injection layer 161. For example, the hole transport layer 162 may include N,N-dinaphthyl-N,N'-diphenyl benzidine (NPD), N,N'-bis-(3-methylphenyl)-N,N'-bis-(phenyl)-benzidine (TPD), s-TAD, 4,4',4''-tris(N-3-methylphenyl-N-phenyl-amino)-triphenylamine (MTDATA), and/or the like, but is not limited thereto.

In the present exemplary embodiment, formation of the structure where the hole injection layer 161 and the hole transport layer 162 are laminated is described, but is not limited thereto, and the hole injection layer 161 and the hole transport layer 162 may be formed of a single layer.

The present specification may further include a buffer layer positioned on the hole transport layer. The buffer layer may adjust an amount of holes transferred from the first electrode 160 to the emission layer 173, and concurrently (e.g., simultaneously), may adjust an amount of electrons penetrating the hole transport layer 162 from the emission layer 173.

That is, the buffer layer may serve as a hole adjustment and electron blocking layer to help combination of the holes and the electrons in the emission layer 173, and may block the electrons that may penetrate the hole transport layer 162 to reduce or prevent a damage of the hole transport layer 162 due to the electrons.

The emission layer 173 includes a light emitting material displaying a color (e.g., a predetermined color). For example, the emission layer 173 may display primary colors such as a blue, green, or red color, or a combination color thereof. As an example of the present invention, the emission layer 173 may include a blue emission layer, a green emission layer, and a red emission layer.

The emission layer 173 includes a host and a dopant. The emission layer 173 may include a material emitting red, green, blue, and white light, and may be formed by using a phosphorescent, fluorescent material, and/or the like.

In the case where the emission layer 173 emits red light, the emission layer may be formed of a phosphorescent material including a host material including carbazole biphenyl (CBP), 1,3-bis(carbazol-9-yl (mCP), and/or the like, and a dopant including bis(1-phenylisoquinoline)acetylacetonate iridium (PIQIr(acac), bis(1-phenylquinoline)acetylacetonate iridium (PQIr(acac), (tris(1-phenylquinoline)iridium (PQIr), octaethylporphyrin platinum (PtOEP), and/or the like. The emission layer may be formed of a fluorescent material including PBD:Eu(DBM)3(Phen), perylene, and/or the like, but is not limited thereto. In the case where the emission layer 173 emits green light, the emission layer 173 may be formed of a phosphorescent material including a host material including CBP or mCP, a dopant material including (fac-tris(2-phenylpyridine)iridium (Ir(ppy)3), and/or the like. The emission layer may be formed of a fluorescent material including (tris(8-hydroxyquinolino)aluminum (Alq3), but is not limited thereto.

In the case where the emission layer 173 emits blue light, the emission layer 173 may be formed of a phosphorescent material including a host material including CBP and/or mCP and a dopant material including (4,6-F2ppy)2Irpic. The emission layer 173 may be formed of a fluorescent material including any one selected from the group consisting of spiro-DPVBi, spiro-6P, distilbenzene (DSB), distyrylarylene (DSA), a PFO-based polymer, and a PPV-based polymer, but is not limited thereto.

Further, the electron transport layer 174 may be positioned on the emission layer 173. In this case, the electron transport layer 174 may transfer the electrons from the second electrode 180 to the emission layer 173. Furthermore, the electron transport layer 174 may prevent or substantially prevent the holes injected from the first electrode 160 from moving to the second electrode 180 through the emission layer 173. That is, the electron transport layer 174 serves as a hole blocking layer to help the combination of the holes and the electrons in the emission layer 173.

In this case, the electron transport layer 174 may be formed of (tris(8-hydroxyquinolino)aluminum (Alq3), PBD, TAZ, spiro-PBD, BAIq, and SAIq, and/or the like, but is not limited thereto.

The electron injection layer 175 is positioned on the electron transport layer 174. The electron injection layer 175 is a layer (e.g., a predetermined layer) improving (e.g., increasing rate of) injection of the electrons from the second electrode 180 into the electron transport layer 174. The electron injection layer 175 may include Alq3, LiF, a gallium mixture (Ga complex), PBD, and/or the like, but is not limited thereto.

The second electrode 180 is positioned on the electron injection layer 175. A material of the second electrode 180 may be any one of silver (Ag) and an alloy thereof (Ag:Yb, Ag:Mg, Ag:Al, Ag:Al:Mg, and/or the like), and the second electrode may be formed of a plurality of layers. In the second electrode 180 including silver (Ag) and the alloy thereof, reflectance is excellent and light absorption is minute, and thus high reliability and stability with respect to the device may be provided.

According to the exemplary embodiment of the present invention, a thickness d of the emission layer 173 and the second layers 174 and 175 (i.e., the combined thicknesses of the emission layer 173 and the second layers 174 and 175) satisfies the following Equation (1).

$$d = \frac{\lambda}{4k} - \alpha \qquad \text{Equation (1)}$$

In Equation (1), $\lambda$ is a light wavelength, k is an absorption coefficient, and $\alpha$ is an adjustment factor. In this case, the light wavelength is a wavelength according to a color of light emitted by each organic light emitting element, and the absorption coefficient is determined according to a material of the second electrode.

The adjustment factor $\alpha$ of Equation (1) may vary according to an emission color of the emission layer 173. That is, a value of the adjustment factor $\alpha$ may vary according to the red emission layer, the green emission layer, and the blue emission layer.

For example, the adjustment factor $\alpha$ of Equation (1) may include a red adjustment factor $\alpha_r$, a green adjustment factor $\alpha_g$, and a blue adjustment factor $\alpha_b$, and values of the red adjustment factor $\alpha_r$, the green adjustment factor $\alpha_g$, and the blue adjustment factor $\alpha_b$ are different from each other.

For example, the adjustment factor value may be increased in the order of the red adjustment factor $\alpha_r$, the green adjustment factor $\alpha_g$, and the blue adjustment factor $\alpha_b$. For example, a ratio of the red adjustment factor $\alpha_r$ to the blue adjustment factor $\alpha_b$ may be about 1.6 to about 2.0.

According to the exemplary embodiment of the present invention, as expressed in Equation (1), a thickness (i.e., the combined thicknesses) of the emission layer and the second layer determined through the adjustment factor is caused by the cathode made of silver (Ag) or an alloy material thereof. This is because, as compared to the cathode made of aluminum (Al) or an alloy material thereof, only when the thickness of the emission layer and the second layer is small, the same or more light efficiency is exhibited. Therefore, according to the exemplary embodiment of the present invention, as compared to the organic light emitting diode display including the cathode not requiring a separate adjustment factor, the thickness of the emission layer and the second layer may be small.

As described above, a thickness (i.e., the combined thicknesses) of the red emission layer and the second layer determined by Equation (1) may be determined by a light emission wavelength, an absorption coefficient, and a red adjustment factor, and for example, may be 700 Å or less. Further, a thickness (i.e., the combined thicknesses) of the green emission layer and the second layer may be determined by the light emission wavelength, the absorption coefficient, and a green adjustment factor, and for example, may be 600 Å or less. Further, a thickness (i.e., the combined thicknesses) of the blue emission layer and the second layer may be determined by the light emission wavelength, the absorption coefficient, and a blue adjustment factor, and for example, may be 460 Å or less. In this case, a ratio of the thickness (i.e., the combined thicknesses) of the red emission layer and the second layer to the thickness (i.e., the combined thicknesses) of the blue emission layer and the second layer satisfying Equation (1) may be about 1.4 or more and about 1.8 or less, and for example, about 1.7.

First, because the wavelengths of lights emitted from the emission layer 173 are different from each other, the thicknesses of the red emission layer, the green emission layer, and the blue emission layer and the second layers 174 and 175 satisfying Equation (1) are made different from each other.

As illustrated in FIG. 4, when the thickness of the red emission layer 173R and the second layers 174 and 175 is defined as $d_R$, the thickness of the green emission layer 173G and the second layers 174 and 175 is defined as $d_G$, and the thickness of the blue emission layer 173B and the second layers 174 and 175 is defined as $d_B$, the thickness $d_R$ of the red emission layer 173R emitting red light having the longest wavelength and the second layer has the largest value, and the thickness $d_B$ of the blue emission layer 173B emitting blue light having the shortest wavelength and the second layer has the smallest value. That is, $d_R > d_G > d_B$.

Hereinafter, light efficiency of the organic light emitting element according to the exemplary embodiment of the present invention will be described with reference to Table 1.

TABLE 1

|  | Red emission layer (cd/A) | Green emission layer (cd/A) | Blue emission layer (cd/A) | Light efficiency (cd/A) |
| --- | --- | --- | --- | --- |
| Comparative Example 1 (Al) | 48.4 | 55.1 | 79.6 | 28.3 |
| Comparative Example 2 (Yb/AgYb) | 36.9 | 52.4 | 65.4 | 24.2 |
| Exemplary Embodiment | 66.7 | 54.7 | 81.5 | 30.0 |

First, Comparative Example 1 shows the light efficiency of the organic light emitting element including the cathode made of an aluminum material, and Comparative Example 2 shows the light efficiency of the organic light emitting element having the same or substantially the same thickness of the emission layer and the second layer as that of Comparative Example 1 and including the cathode made of a silver alloy material. The Exemplary Embodiment shows the light efficiency of the organic light emitting element including the cathode made of the silver (Ag) alloy material and having the thickness of the emission layer and the second layer satisfying Equation (1).

Reviewing Table 1, it was confirmed that, in Comparative Example 2 having the cathode made of the aluminum material, as in Comparative Example 1, and the same or substantially the same thickness of the emission layer and the second layer, as compared to Comparative Example 1, light efficiency was significantly reduced. This was because a change in physical properties according to a change in material of the cathode was not considered.

On the other hand, it could be seen that the organic light emitting element including the cathode made of the silver alloy material, as in the Exemplary Embodiment of the present invention, and having the thickness of the emission layer and the second layer adjusted according to the adjustment factor of Equation (1) had excellent light efficiency as compared to Comparative Examples 1 and 2.

To summarize, in the organic light emitting diode display according to the exemplary embodiment of the present invention, the thickness of the emission layer and the second layer is adjusted according to the material of the cathode, and thus improved (e.g., increased) light efficiency may be provided.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. When an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. §112, first paragraph, and 35 U.S.C. §132(a).

While this invention has been described in connection with what is presently considered to be practical exemplary embodiments, it is to be understood that the invention is not limited to the disclosed embodiments, but, on the contrary, is intended to cover various suitable modifications and equivalent arrangements included within the spirit and scope of the appended claims, and equivalents thereof.

DESCRIPTION OF SOME OF THE SYMBOLS

| | |
|---|---|
| 123: Substrate | 130: Thin film transistor |
| 160: First electrode | 180: Second electrode |
| 171: Hole injection layer | 172: Hole transport layer |
| 173: Emission layer | 174: Electron transport layer |
| 175: Electron injection layer | |

What is claimed is:

1. An organic light emitting diode display comprising:
a substrate;
a thin film transistor on the substrate;
a first electrode connected to the thin film transistor;
a first layer on the first electrode;
an emission layer on the first layer;
a second layer on the emission layer; and
a second electrode on the second layer,
wherein a thickness d of the emission layer and the second layer satisfies the following $$d = \frac{\lambda}{4k} - \alpha$$

where, $\lambda$ is a wavelength of light emitted by the emission layer, k is an absorption coefficient of the second electrode, and $\alpha$ is an adjustment factor, and
wherein the emission layer comprises a red emission layer and a blue emission layer and the adjustment factor comprises a red adjustment factor $\alpha_r$ and a blue adjustment factor $\alpha_b$, a ratio of the red adjustment factor $\alpha_r$ to the blue adjustment factor $\alpha_b$ being about 1.6 to about 2.0.

2. The organic light emitting diode display of claim 1, wherein the emission layer further comprises a green emission layer.

3. The organic light emitting diode display of claim 2, wherein the adjustment factor varies according to an emission color of the emission layer.

4. The organic light emitting diode display of claim 2, wherein the adjustment factor further comprises a green adjustment factor $\alpha_g$.

5. The organic light emitting diode display of claim 4, wherein values of the red adjustment factor $\alpha_r$, the green adjustment factor $\alpha_g$, and the blue adjustment factor $\alpha_b$ are increased in the stated order.

6. The organic light emitting diode display of claim 2, wherein thicknesses of the red emission layer and the second layer are 700 Å or less.

7. The organic light emitting diode display of claim 2, wherein thicknesses of the green emission layer and the second layer are 600 Å or less.

8. The organic light emitting diode display of claim 2, wherein thicknesses of the blue emission layer and the second layer are 460 Å or less.

9. The organic light emitting diode display of claim 2, wherein a ratio of the thickness of the red emission layer and the second layer to the thickness of the blue emission layer and the second layer is about 1.4 to about 1.8.

10. The organic light emitting diode display of claim 1, wherein a material of the second electrode is any one selected from silver (Ag) and an alloy thereof.

11. The organic light emitting diode display of claim 1, wherein the first electrode is an anode and the second electrode is a cathode.

12. The organic light emitting diode display of claim 1, wherein the first layer comprises a hole transport layer and/or a hole injection layer.

13. The organic light emitting diode display of claim 1, wherein the second layer comprises an electron transport layer and/or an electron injection layer.

* * * * *